United States Patent [19]
Nitta

[11] Patent Number: 6,091,745
[45] Date of Patent: Jul. 18, 2000

[54] SEMICONDUCTOR LASER CAPABLE OF CHANGING POLARIZATION MODE OF ITS OUTPUT LIGHT, SEMICONDUCTOR LASER APPARATUS AND DRIVING METHOD THEREFOR

[75] Inventor: Jun Nitta, Ninomiya-machi, Japan

[73] Assignee: Canon Kabushiki Kaisha, Tokyo, Japan

[21] Appl. No.: 08/916,231

[22] Filed: Aug. 22, 1997

[30] Foreign Application Priority Data

Aug. 22, 1996 [JP] Japan .................................. 8-239800
Aug. 5, 1997 [JP] Japan .................................. 9-223082

[51] Int. Cl.[7] ...................................................... H01S 3/102
[52] U.S. Cl. .................. 372/27; 372/50; 372/96
[58] Field of Search .................. 372/19, 27, 96, 372/45, 50

[56] References Cited

U.S. PATENT DOCUMENTS 5,471,335 11/1995 Nitta ........................................ 359/179
5,586,131 12/1996 Ono et al. .................................. 372/19
5,606,176 2/1997 Nitta ........................................ 257/18
5,659,560 8/1997 Ouchi et al. .............................. 372/27
5,699,373 12/1997 Uchida et al. ............................ 372/27
5,757,840 5/1998 Hiroki ...................................... 372/96
5,764,670 6/1998 Ouchi ...................................... 372/45

FOREIGN PATENT DOCUMENTS 2-159781 6/1990 Japan .
7-162088 6/1995 Japan .
8-274412 10/1996 Japan .

Primary Examiner—James W. Davie
Attorney, Agent, or Firm—Fitzpatrick, Cella, Harper & Scinto

[57] ABSTRACT

In a semiconductor laser capable of changing its polarization mode, there are arranged a plurality of regions in its cavity direction and each region includes an active layer and a diffraction grating. The laser is driven by performing a control for switching the polarization mode to a region of the laser, out of the plurality of regions, where a refractive index is easier to be changed by a control than the other region.

6 Claims, 9 Drawing Sheets

SEMICONDUCTOR LASER CAPABLE OF CHANGING POLARIZATION MODE OF ITS OUTPUT LIGHT, SEMICONDUCTOR LASER APPARATUS AND DRIVING METHOD THEREFOR

BACKGROUND OF THE INVENTION

1. Field of the Invention

The present invention relates to a semiconductor laser capable of changing a polarization mode of its output light, a semiconductor laser apparatus and a driving method therefor.

2. Related Background Art

Conventionally, Japanese Patent Laid-Open Application No. 2 (1990)-159781 discloses a three-electrode distributed feedback (DFB) laser with a λ/4 phase-shift section whose polarization mode of output light can be varied between the TE mode and the TM mode depending on its stimulated condition. In the DFB semiconductor laser of that reference, there are arranged three electrodes for independently injecting currents into a region with the λ/4 phase-shift section and other regions without any λ/4 phase-shift sections. The polarization-mode modulation operation of this laser device is performed as follows. The laser is brought into a laser-oscillated condition by appropriately injecting a current through each electrode, and the polarization mode of its output light is changed between the TE mode and the TM mode by slightly varying the current injected into the region with the λ/4 phase-shift section under the laser-oscillated condition. Thus, in the above-discussed three-electrode DFB semiconductor laser, the current injected into the region with the λ/4 phase-shift section is varied and its equivalent refractive index is accordingly changed such that the oscillation occurs at a wavelength and in the TE mode or the TM mode which satisfy the device's phase matching condition and take a minimum threshold gain.

Further, Japanese Patent Laid-Open Application No. 7 (1995)-162088 discloses a two-electrode DFB laser which has a simple structure. In this DFB laser, its oscillation polarization mode is switched by injecting different currents through the two electrodes and modulating one of the two different currents. In this structure, a difference between Bragg wavelengths for the TE mode and the TM mode in one region is made different from that in another region by injecting different bias currents through the two electrodes and the current injected into one region is varied under this stimulated condition such that its oscillation polarization mode is changed.

Furthermore, Japanese Patent Laid-Open Application No. 8 (1996)-274412 discloses a polarization-mode selective DFB laser in which equivalent refractive indices of respective regions are made structurally different from each other along its cavity direction. In this structure, there are arranged regions having different refractive indices in its cavity direction, and hence differences between propagation constants (i.e, differences between equivalent refractive indices) for the TE mode and the TM mode in the respective regions are made different from each other. Thus, it is possible to switch the oscillation polarization mode more stably than another conventional structure, such as the structure as disclosed in Japanese Patent Laid-Open Application No. 2 (1990)-159781.

SUMMARY OF THE INVENTION

It is an object of the present invention to provide a semiconductor laser capable of changing a polarization mode of its output light, a semiconductor laser apparatus and a driving method therefor.

According to the present invention, there are provided a construction capable of performing a polarization switching with excellent efficiency and a construction capable of performing a polarization switching with excellent stability. While the polarization mode can be changed by changing an amount of a current injected into one of the two or three regions arranged in the cavity direction in the above-mentioned Japanese Patent Laid-Open Application No. 2 (1990)-159781 and Japanese Patent Laid-Open Application No. 8 (1996)-274412, the present invention provides a construction capable of changing its polarization mode without needing a very complicated control with adverse influences on its output power and oscillation wavelength being opppressed. More specifically, according to the present invention, there is provided a construction in which a polarization mode is changed mainly by a current injected through an electrode of a multi-electrode DFB laser capable of changing its polarization mode and an output power is controlled mainly by a current injected through another electrode.

In a laser capable of changing its polarization mode, which is provided according to one aspect of the present invention, there are arranged along its cavity direction a plurality of regions each having an active layer and a diffraction grating, and a control for changing its polarization mode is performed on a region, out of the plural regions, where its refractive index can be changed by an external control more readily than the other region(s). As a method for changing an oscillation polarization mode between two polarization modes, there exists a method of changing the oscillation polarization mode to a polarization mode, which is to be more readily oscillated, by changing phases of the two respective polarization modes. Since the phase can be changed by changing the refractive index, the polarization mode can be efficiently changed by performing a control for changing the polarization mode to a region whose refractive index can be more readily changed. The control for changing the polarization mode is a control for controlling an amount of an injected current, for example. Further, since influence on the phase of light due to a change in an injected current is small in a region where its refractive index is hard to be changed by an external control, such as a control of an amount of the injected current, a control of a light power can be performed mainly by the control of the amount of the current injected into that region with adverse influences on the other controls being suppressed.

Further, in a laser capable of changing its polarization mode, which is provided according to another aspect of the present invention, there are arranged along its cavity direction a plurality of regions each having an active layer and a diffraction grating, the plural regions respectively have different thresholds provided when each region is independently driven, and a current injected into a region with a larger threshold is controlled to change its polarization mode. For the sake of simplicity, explanation will be made employing a case where there are two regions and densities of currents injected into those two regions are not so different from each other. When the current densities are increased and the injected current comes to exceed the threshold of one region (i.e., the threshold of a region having a smaller threshold) to a certain extent, laser oscillation takes place in a region with a larger threshold even if such current as exceeds the threshold is not injected therein. At this time, in the region with a larger threshold, since the current injected therein does not yet reach the threshold, its refractive index can be efficiently changed by a control of an amount of the current injected therein. Thus, an efficient change of the polarization mode can be achieved.

In order to make the above-discussed thresholds different from each other, layer structures of the plural regions only need to be differently formed, for example. Those thresholds can be made different by using different materials, or making their mole fractions or shapes different, for example. More specifically, thicknesses of active layers in the plural regions are made different to make the thresholds different from each other. Furthermore, those thresholds can be different from each other by making depths or shapes of the diffraction gratings different in the plural regions.

Further, in a laser capable of changing its polarization mode, which is provided according to yet another aspect of the present invention, there are arranged along its cavity direction a plurality of regions each having an active layer and a diffraction grating, the plural regions respectively have different coupling coefficients, and a current injected into a region with a smaller coupling coefficient is controlled to change its polarization mode. In the region with the smaller coupling coefficient, since the threshold is larger than that in the region(s) with the larger coupling coefficient, the polarization mode can be efficiently changed by the control of the amount of the current injected therein.

In order to make the coupling coefficients in the plural regions different from each other, shapes of the diffraction gratings themselves or layer structures for forming the diffraction gratings in the plural regions only need to be made different from each other, for example. More specifically, depths of the diffraction gratings or index differences between two layers, at an interface of which each diffraction grating is formed, are made different from each other.

Further in a laser capable of changing its polarization mode, which is provided according to still another aspect of the present invention, there are arranged along its cavity direction a plurality of regions each having an active layer and a diffraction grating and that a $\lambda/4$ phase shift section (i.e, a $\lambda/4$ phase shift section for causing a phase shift of $\lambda/4(2n+1)$ $(n=0, 1, \ldots)$) is provided in a region with a larger equivalent refractive index out of the plural regions. In this structure, the polarization mode can be stably changed by making the equivalent refractive indices in the plural regions different from each other. In the region provided with the $\lambda/4$ phase shift section, a photon density is large and a carrier density is smaller than that in the other region. Thus, the refractive index thereof is large. Therefore, in such a laser, since the $\lambda/4$ phase shift section is formed in the region with a large equivalent refractive index, the polarization mode can be further stably changed.

In order to make the equivalent refractive indices in the plural regions different from each other, layer structures in the plural regions only need to be made different from each other, for example. More specifically, the equivalent refractive indices can be made different from each other by making materials of layers, their mole fractions, their shapes or the like different from each other. For example, thicknesses of light guide layers in the plural regions are made different from each other to make the equivalent refractive indices different from each other.

Further, the above-discussed semiconductor laser can be controlled so as to change its polarization mode in accordance with a modulated signal, and thus a polarization-modulated optical signal can be obtained. The semiconductor laser of the present invention can be used as a light source for outputting a polarization-modulated optical signal. An intensity-modulated optical signal can be obtained by selecting only one polarization mode from the polarization-modulated optical signal. Specifically, the polarization mode can be picked out by using a polarizer, for example.

Further, the above-discussed semiconductor laser can be controlled so as to change its polarization mode in accordance with a modulated signal, and thus a polarization-modulated optical signal can be obtained. Thus, an optical transmitter for transmission of the optical signal can be constructed. An intensity-modulated optical signal may be transmitted by selecting only one polarization mode as described above and outputting the selected polarization.

Further, an optical transmitter can be constructed by using a semiconductor apparatus including the above-discussed semiconductor laser and a control circuit for controlling its polarization mode. An intensity-modulated optical signal can be obtained from the optical transmitter by providing therein a polarization selecting unit, such as a polarizer.

Futhermore, an optical communication system can be built by using the above optical transmitter.

These advantages and others will be more readily understood in connection with the following detailed description of the preferred embodiments in conjunction with the drawings.

DESCRIPTION OF THE PREFERRED EMBODIMENTS

Embodiments having specific structures will be described hereinafter.

First Embodiment

Figure 1:
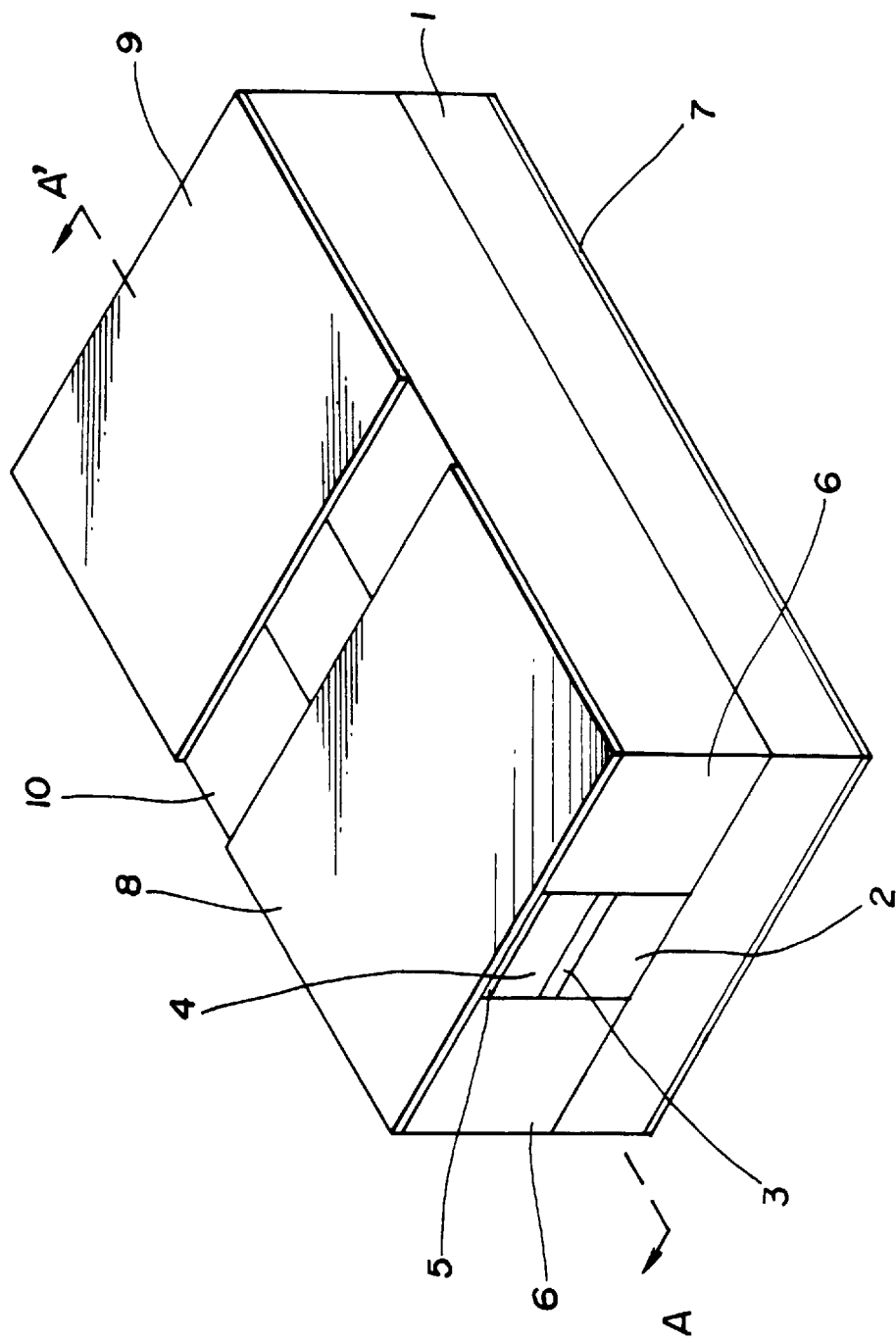
FIG. 1 is a schematic perspective view illustrating the structure of a first embodiment of the present invention.
Figure 2:
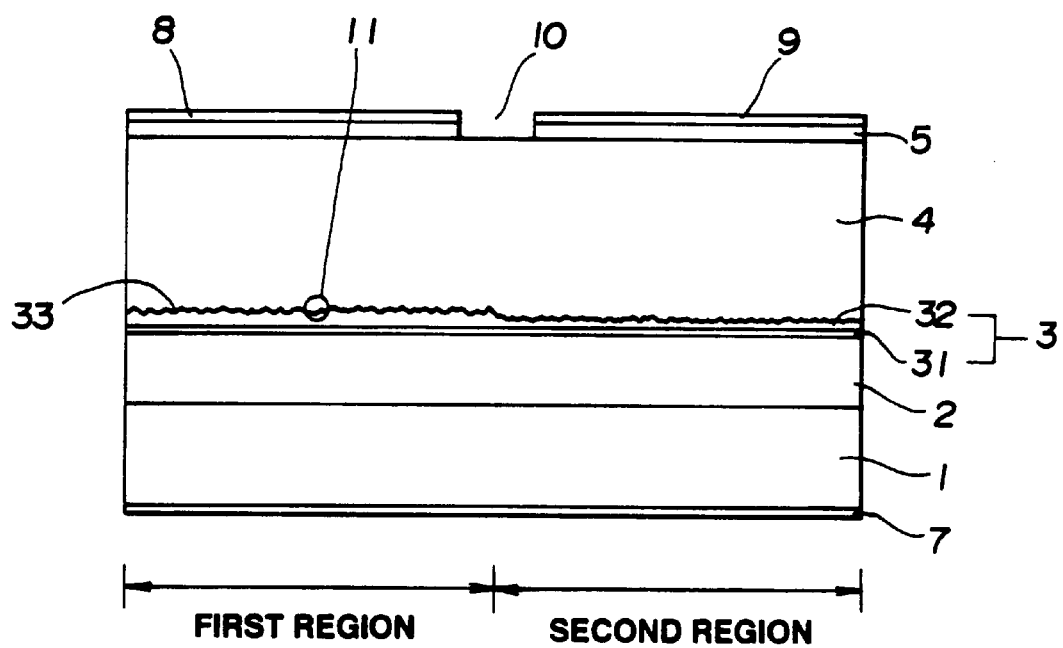
FIG. 2 is a cross-sectional view of the first embodiment taken along a line A–A' of FIG. 1.

FIGS. 1 and 2 illustrate a first embodiment of the present invention. In FIG. 1, reference numeral 1 denotes a substrate of an n-type InP. Reference numeral 2 denotes a first clad layer of an n-type InP. Reference numeral 3 denotes an active layer region. Reference numeral 4 denotes a second clad layer of a p-type InP. Reference numeral 5 denotes a cap layer of a p-type InGaAs. Reference numeral 6 denotes a burying layer of a high-resistance or semi-insulating InP. Reference numerals 7, 8 and 9 respectively denote first, second and third electrodes. Reference numeral 10 denotes a separation groove for electrically separating the second electrode 8 from the third electrode 9.

FIG. 2 illustrates a cross-section of a device of the first embodiment, taken from a line A–A' extending along the length of its cavity in FIG. 1. The same elements as those in FIG. 1 are designated by the same reference numerals in FIG. 2. In FIG. 2, reference numeral 31 denotes an active layer of an undoped InGaAsP whose gain peaks for the TE mode and the TM mode compete with each other. Reference numeral 32 denotes a light guide layer whose band gap energy, here 1.078 eV, is larger than that of the active layer 31. Reference numeral 33 denotes a diffraction grating whose pitch is approximately 240 nm and which is formed at an interface between the light guide layer 32 and the second clad layer 4. Reference numeral 11 denotes a $\lambda/4$ phase-shift section formed in the diffraction grating 33.

The sizes of the respective layers are as follows: The thicknesses of the first clad layer 2, the active layer 31, the second clad layer 4 and the cap layer 5 are respectively approximately 0.5 $\mu$m, 0.1 $\mu$m, 1.2 $\mu$m and 0.5 $\mu$m. The width of the separation groove 10 in the cavity direction is approximately 20 $\mu$m. The width of the first clad layer 2, the active region 3, the second clad layer 4 and the cap layer 5, whose surroundings in a lateral direction are buried with the burying layer 6, is approximately 2 $\mu$m. Further, the thickness of a first region's portion of the light guide layer 32 under the second electrode 8 is different from the thickness of a second region's portion of the light guide layer 32 under the third electrode 9. The former thickness is about 0.15 $\mu$m, while the latter thickness is about 0.1 $\mu$m. As a result, the first region is a region having a relatively larger equivalent refractive index, while the second region is a region having a relatively smaller equivalent refractive index.

Devices having the above-discussed structure can be fabricated by using conventional growth techniques, such as CBE (chemical beam epitaxy), OMVPE (organic metal vapor phase epitaxy)and MBE (molecular beam epitaxy), and semiconductor processings, such as lithography and dry etching.

Figure 6A:
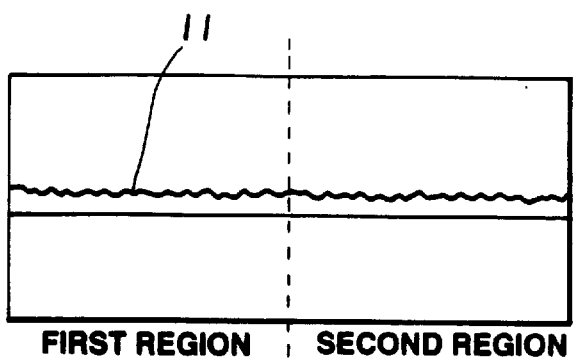
FIGS. 6A–6D are respectively views for explaining the principle of operation of a polarization-mode selective semiconductor laser of the present invention.
Figure 6B:
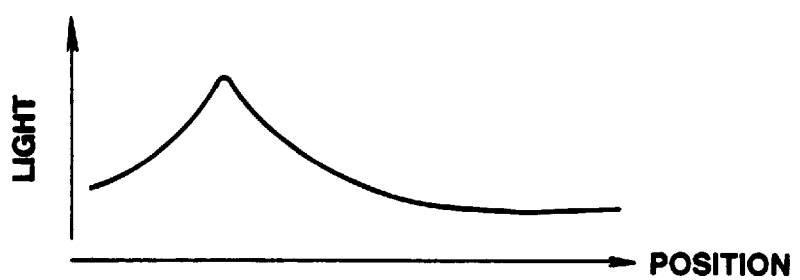
Figure 6C:
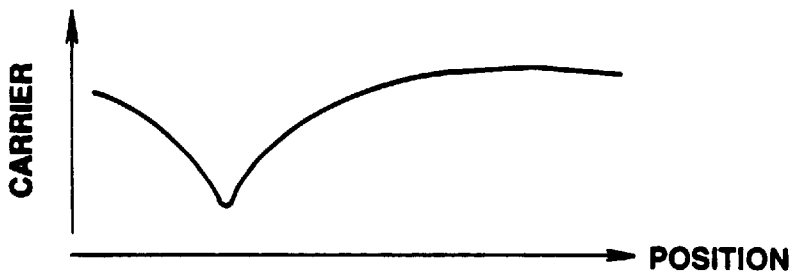

The operation of the first embodiment will be described. When a current is uniformly injected into the above-discussed structure, an optical distribution along the cavity direction of the device has a strong-intensity portion around a place of the $\lambda/4$ phase-shift section 11, as illustrated in FIG. 6B which is illustrated corresponding to the device's structure of FIG. 6A. Therefore, as illustrated in FIG. 6C, the carrier density is small in the first region with the $\lambda/4$ phase-shift section 11 and is large in the second region with no phase-shift section (these cavity intensities are relative to each other).

Figure 6D:
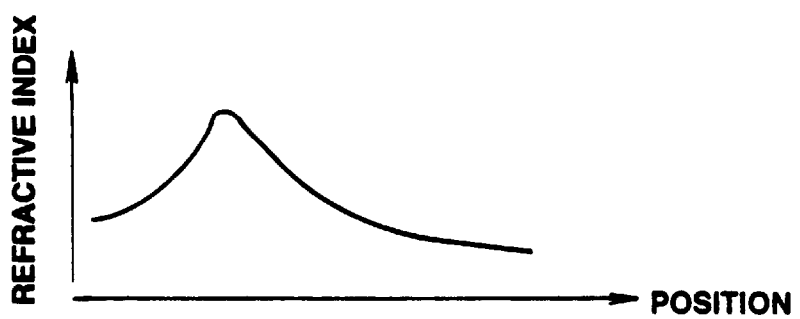

In such a state, the polarization mode of the output light from the device is assumed to be the TE mode in this embodiment (this assumption can be attained by appropriately setting the structure of the active layer 31 and the like, the pitch of the diffraction grating 33 and so forth). Then, when the current injected into the first region with a relatively large refractive index as illustrated in FIG. 6D is increased and hence carriers are increased therein, the refractive index thereof is relatively largely changed to a smaller value accordingly. As a result, the Bragg wavelength in the first region with the $\lambda/4$ phase-shift section 11 is changed to a shorter wavelength side, and light in the TM mode is output from the device when the phase of TM-polarized light in the second region matches up to the phase of TM-polarized light in the first region with the $\lambda/4$ phase-shift section 11. At this time, the magnitude of gain minus loss for the TM mode naturally exceeds the magnitude of gain minus loss for the TE mode. In other words, the active layer 31, the pitch of the diffraction grating 33 and the like are fabricated and the gain peaks, wavelengths of the gain peaks, Bragg wavelengths for the TE mode and the TM mode and so forth are set such that the above-discussed conditions are satisfied.

Second Embodiment

Figure 3:
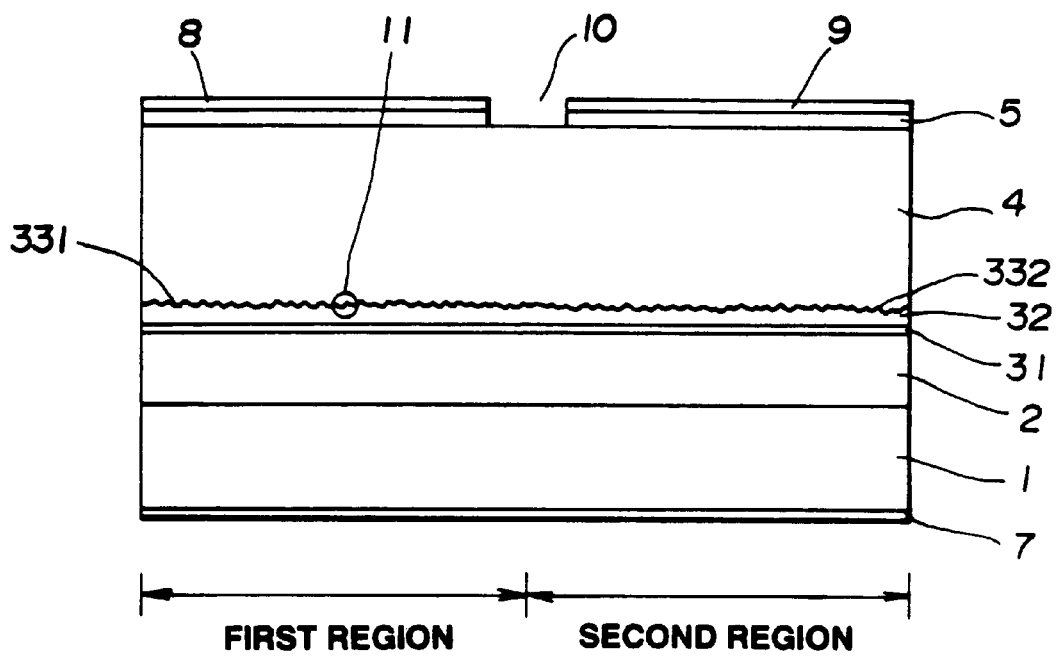
FIG. 3 is a cross-sectional view of a second embodiment of the present invention along a cavity direction.

FIG. 3 illustrates a cross-section of a second embodiment of the present invention taken along its cavity direction. In FIG. 3, the same elements as those of the first embodiment are designated by the same reference numerals. The second embodiment differs from the first embodiment in that the depth of a grating 331 in the first region with the $\lambda/4$ phase-shift section 11 is different from the depth of a grating 332 in the second region with no phase-shift section while the uniform grating 33 is formed in the first embodiment. In the second embodiment, the depth of the grating 331 in the first region is set to 20 nm, the depth of the grating 332 in the second region is set to 50 nm, and the thickness of the light guide layer 32 is uniform over the first and second regions. In the thus-fabricated structure of the second embodiment, a threshold value of the first region, in which the depth of the grating 331 is small and thus the coupling coefficient is small, is large compared with a threshold value of the second region, in which the depth of the grating 332 is large and thus the coupling coefficient is large.

Therefore, even when current is uniformly injected into the device, the carrier density in the first region can be lowered, compared with a threshold carrier density to be attained solely by the first region, due to smallness of the coupling coefficient of the diffraction grating 331 and presence of the $\lambda/4$ phase-shift section 11. As a result, when a current is further injected into the first region with the $\lambda/4$ phase-shift section 11, the refractive index of the first region can be changed more largely than the refractive index of the second region is changed by a change in current injected thereinto. Thus, round-trip phases for the TE mode and the TM mode can be readily varied.

The following modifications can be made to the second embodiment. In the second embodiment, the unevenness of the carrier distribution is adjusted to a desired value by setting the depths (i.e, coupling coefficients) of the gratings 331 and 332 in the first and second regions differently from each other. For the same purpose, there is a method of setting thicknesses of the active layers 31 in the first and second regions differently from each other, for example. In the first and second embodiments, the thickness of the active layer 31 is uniformly set to 0.1 $\mu$m. In contrast therewith, the same effect can be achieved by setting the thickness of the active layer 31 in the first region to 0.15 $\mu$m, for example. The region with a thicker active layer can be a region where the carrier density is relatively reduced, and hence the refractive index of this region can be readily changed by controling the carrier injection thereinto. This modification is also an example of a DFB semiconductor laser in which a plurality of waveguides with different equivalent refractive indices (the equivalent refractive index of the waveguide including a thicker active layer is comparatively large) are arranged in its cavity direction. The operation principle of the modification is substantially the same as that of the first embodiment and the second embodiment.

In the above-discussed embodiments, there are arranged two regions, namely the first region with the λ/4 phase-shift section and the second region with no phase shift section, but more than two regions may be arranged with the λ/4 phase-shift section being provided in one of the regions in accordance with the concept of the present invention. The operation principle thereof is also substantially the same as that of the first embodiment.

Third Embodiment

Figure 4:
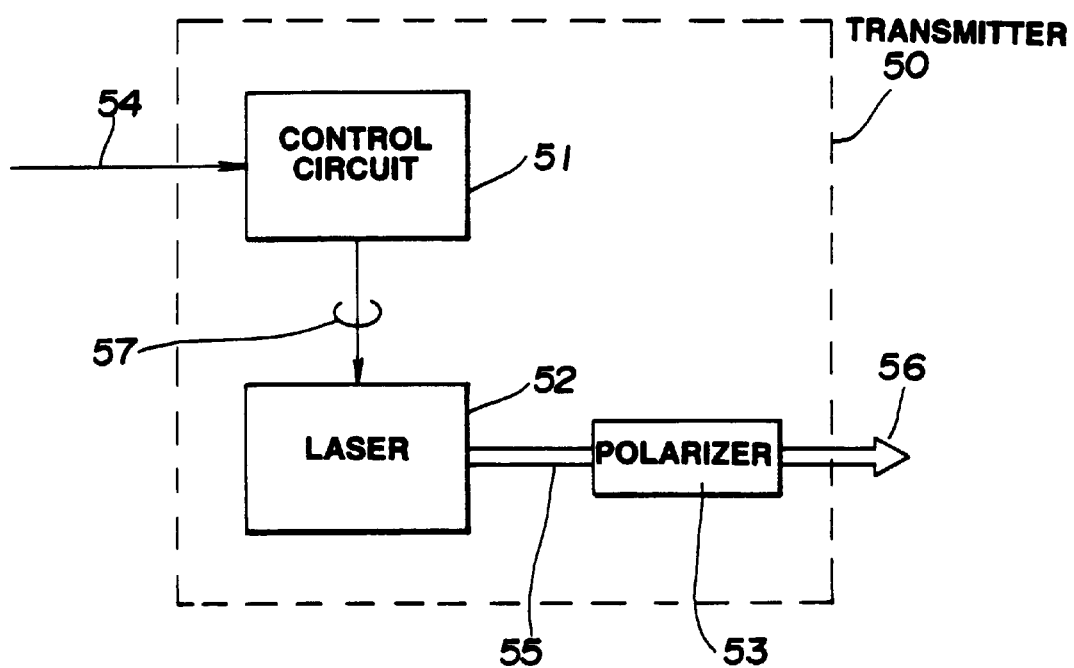
FIG. 4 is a block diagram illustrating the structure of an optical transmitter using a polarization-mode selective semiconductor laser of the present invention.

FIG. 4 illustrates a construction in which a device of the present invention is used as an element constituting an optical transmitter 50. In FIG. 4, reference numeral 51 designates a control circuit. Reference numeral 52 designates a polarization-mode switchable or selective laser of the present invention. Reference numeral 53 designates a polarizer. Reference numeral 54 designates an electric signal input into the transmitter 50 from the outside. Reference numeral 55 designates a light output emitted from the polarization-mode switchable laser 52. Reference numeral 56 designates an optical signal which can be obtained after the polarizer 53 selects a component of the light output 55 in one of two different polarization modes (i.e., either TE-polarized light or TM-polarized light). Reference numeral 57 designates a control signal supplied to the polarization-mode switchable laser 52 from the control circuit 51.

Figure 5:
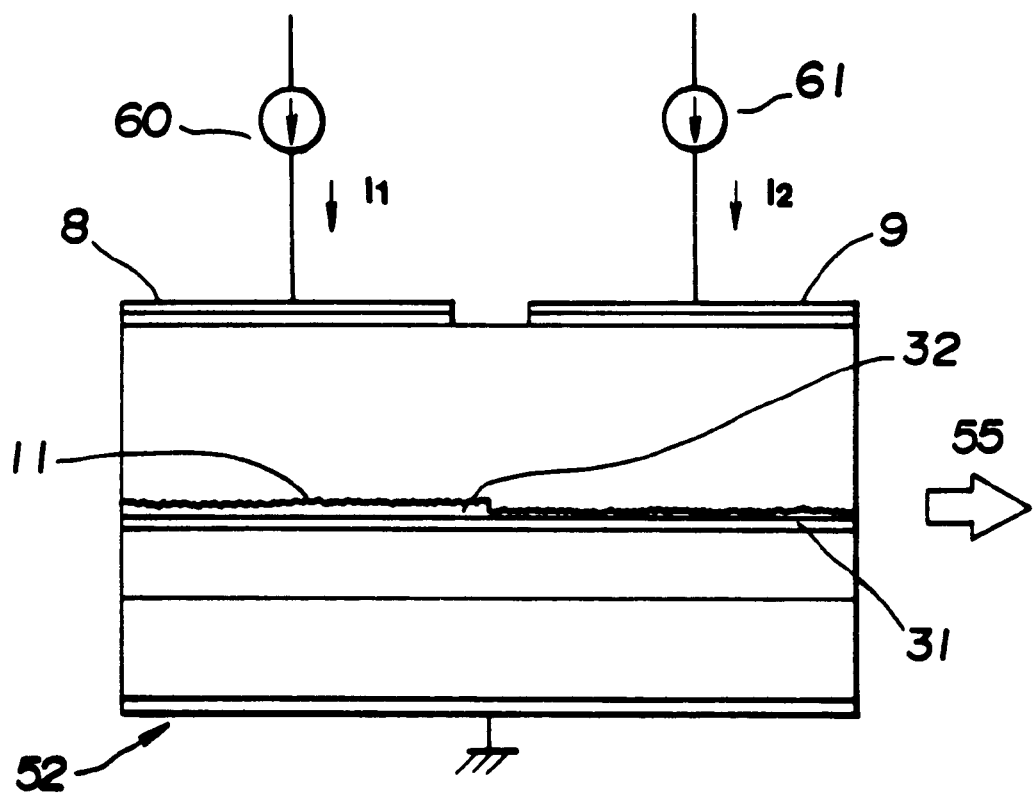
FIG. 5 is a cross-sectional view illustrating a supply of currents to a polarization-mode selective semiconductor laser of the present invention.

In FIG. 4, only the control signal 57 is simply illustrated between the control circuit 51 and the polarization-mode switchable laser 52, but the control circuit 51 is actually connected with the laser 52 as illustrated in FIG. 5. Thus, a desired light output 55 is obtained by controlling electric sources 60 and 61 by the control circuit 51 in accordance with the electric signal 54. The polarization mode of the light output 55 is switched between the TE mode and the TM mode in accordance with "0" and "1" of the electric signal 54. After one polarization mode of the light output 55 is selected by the polarizer 53, the optical signal 56 intensity-modulated in accordance with the electric signal 54 can be obtained.

FIG. 5 illustrates the way to supply electric power or a current to the device of the present invention. The device 52 of the present invention illustrated in FIG. 5, in which the electric sources or current sources 60 and 61 are connected to respective electrodes of the device 52 to inject currents through these electrodes independently from each other, is the same as the device illustrated in FIGS. 1 and 2. Devices of other embodiments can also be connected to source of power or current similarly. A left-side portion of the device 52 in FIG. 5 corresponds to the first region of the device in FIG. 2.

In the device of the present invention, the electric power sources are connected as illustrated in FIG. 5, and a current $I_2$ is injected into the second region with no λ/4 phase-shift section, using the electric source 61. Although it is preferable to incrrese the amount of the current $I_2$, the amount of the current $I_2$ is set to such a degree that the second region can not cause the device's oscillation by itself. Under such a condition, a current $I_1$ is injected into the first region with the λ/4 phase-shift section 11, using the electric power source 60. As the amount of the current $I_1$ injected into the first region is gradually increased, the laser oscillation occurs at a certain point and light is output in the TE mode or the TM mode. Then, when the amount of the current $I_1$ injected into the first region is further increased minutely, the oscillation polarization mode is changed from the TE mode (or the TM mode) to the TM mode (or the TE mode) while the intensity of the output light remains almost unchanged.

Fourth Embodiment

Figure 7:
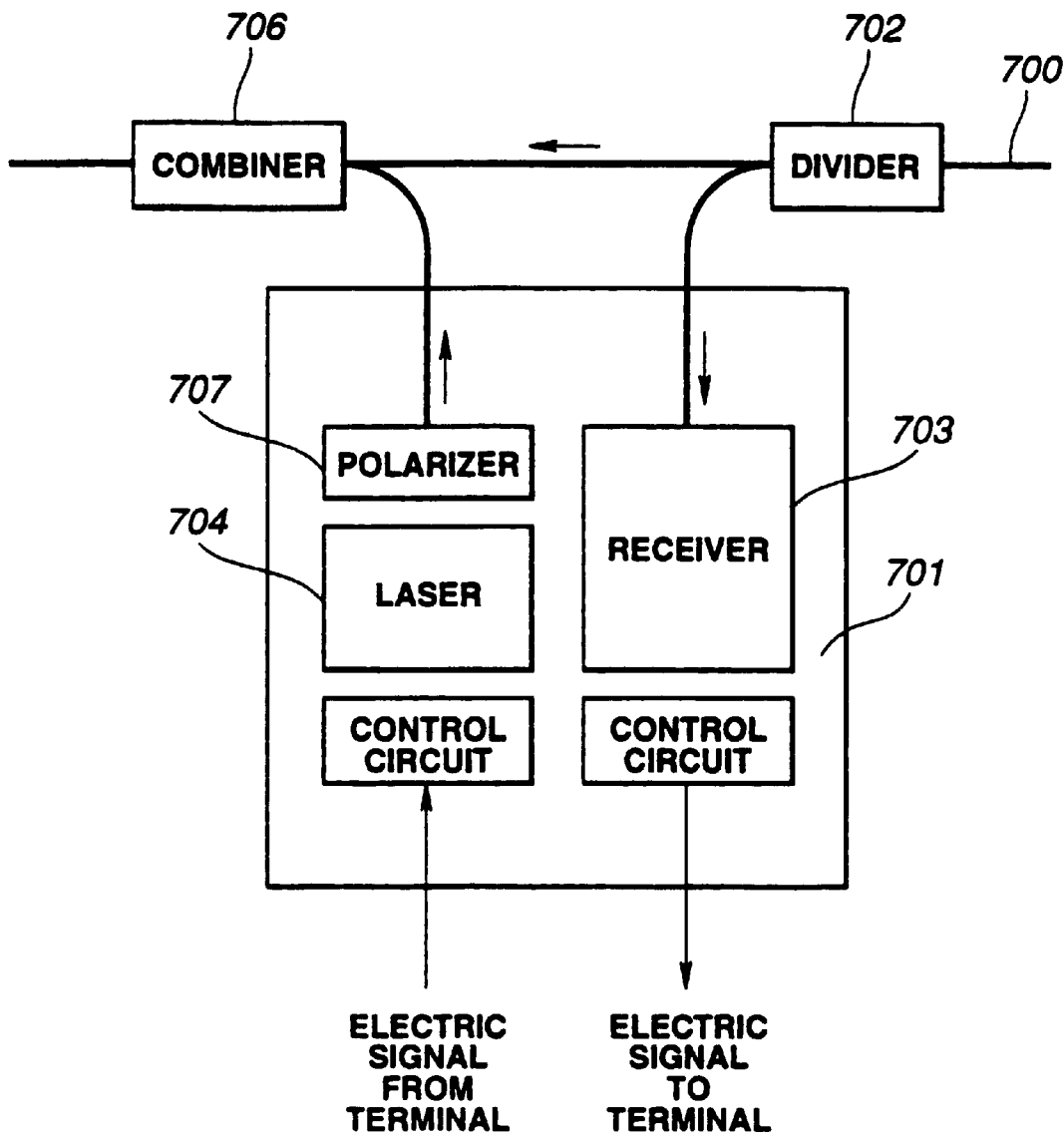
FIG. 7 is a block diagram illustrating the structure of a node (a transceiver) using a polarization-mode selective semiconductor laser of the present invention and used in an optical transmission system.

A fourth embodiment will be described with reference to FIGS. 8 and 9. The fourth embodiment is directed to an optical local area network (LAN) system using an optical communication system of the present invention. FIG. 7 illustrates an opto-electric converting unit (node), which is connected to a terminal of the optical LAN system shown in FIG. 8 or 9.

Figure 8:
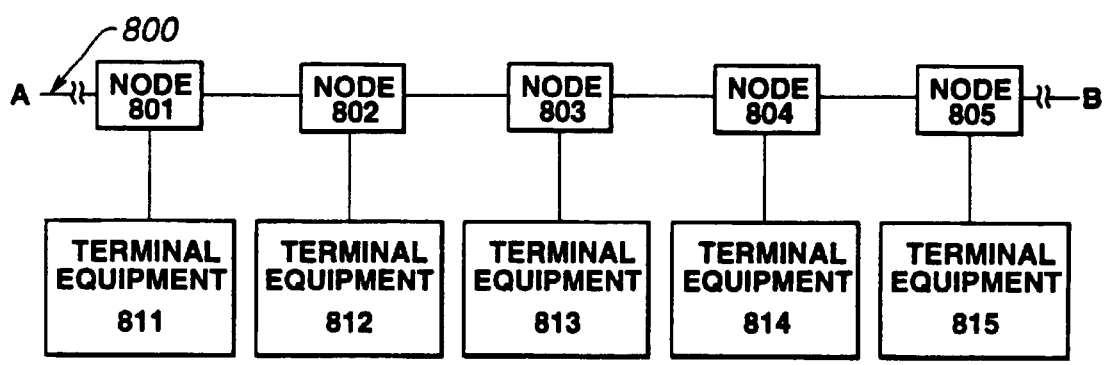
FIG. 8 is a schematic block diagram illustrating the structure of a bus-type optical LAN system using a polarization-mode selective semiconductor laser of the present invention.
Figure 9:
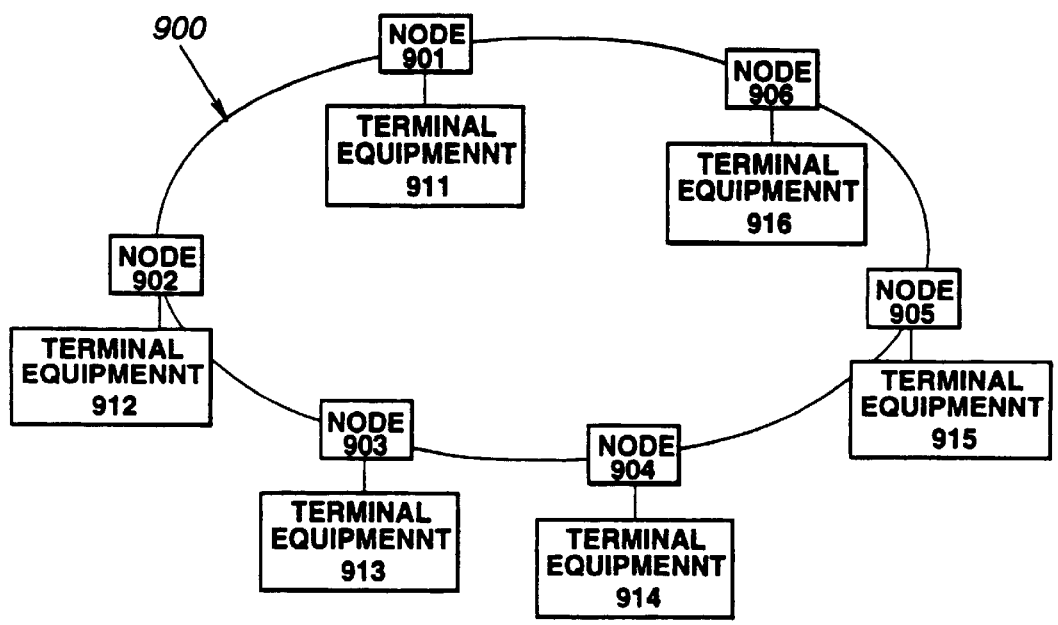
FIG. 9 is a schematic block diagram illustrating the structure of a loop-type optical LAN system using a polarization-mode selective semiconductor laser of the present invention.

In the bus-type network shown in FIG. 8, multiple terminals 811, 812, . . . , and 815 are respectively connected to an optical fiber 800 through nodes 801, 802, . . . , and 805 along a direction A–B. At some places on the optical fiber 800, optical amplifiers (not shown) are serially connected to compensate for attenuation of the transmitted signal light.

In FIG. 7, a light signal is taken into a node 701 through an optical fiber 700, and a portion of the signal is input into an optical receiver 703 by a divider or branching device 702. The optical receiver 703 includes a tunable optical filter and a photodetector, and only signal light at a desired wavelength is taken out from the incident signal light, and the signal is detected. The thus-detected signal is processed by a control circuit to be supplied to the terminal.

On the other hand, when a light signal is transmitted from the node 701, signal light from a light source apparatus or a tunable polarization-mode selective DFB semiconductor laser 704 is input into the optical fiber 700 at a combiner 706 through a polarizer 707 (an isolator may also be inserted). The DFB semiconductor laser 704 is appropriately driven by a control circuit according to a signal to be transmitted. The polarization-modulated output from the DFB semiconductor laser 704 is converted to an amplitude-modulated signal by the polarizer 707. In general, a wavelength change occurs at the same time when the polarization mode is switched in the polarization-mode selective laser. Therefore, the polarization-modulated light from the laser can also be converted into the intensity-modulated light by an optical band pass filter in place of the polarizer.

A plurality of tunable optical filters and tunable DFB lasers may be arranged in a node to widen the wavelength changeable range. Further, two nodes may be connected to each terminal and two optical fibers may be provided to accomplish bi-directional transmission of a DQDB system.

In such an optical network system, when the optical communication system of the present invention is used, a high-density wavelength or optical frequency division multiplexing network can be constructed.

As a network, a loop type (see FIG. 9), which is constructed by connecting A and B in FIG. 8, a star type, or a compound configuration thereof may be used. In FIG. 9, reference numeral 900 denotes a light transmission line, reference numerals 901 to 906 respectively denote optical nodes and reference numerals 911 to 916 respectively denote terminals.

As described in the foregoing, according to the present invention, there is provided a polarization-mode selective semiconductor laser which can stably operate and in which its output power and its oscillation wavelength are less affected than a conventional device when its oscillation polarization mode is modulated, as a typical example.

Except as otherwise disclosed herein, the various components shown in outline or block form in any of the FIGS.

1–9 are individually well known in the optical semiconductor device, driving method therefor and optical communication arts, and their internal construction and operation are not described herein.

While the present invention has been described with respect to what are presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. A driving method for driving a semiconductor laser in which there are arranged along its cavity a plurality of regions each including an active layer and a diffraction grating and a $\lambda/4$ phase shift section is formed in a region where a refractive index is larger than the other region, said driving method comprising:

a step of performing a control for switching a polarization mode of the laser to the region where the $\lambda/4$ phase shift section is formed.

2. A driving method according to claim 1, wherein said control for switching the polarization mode is a control of controlling an amount of a current injected into the region where the $\lambda/4$ phase shift section is formed.

3. A driving method according to claim 1, further comprising a step of controlling a power of output light of the laser by controlling an amount of a current injected into a region where no $\lambda/4$ phase shift section is formed.

4. A semiconductor laser capable of switching a polarization mode of its output light, said laser comprising:

a plurality of regions arranged in a cavity direction of said laser, said regions each including an active layer and a diffraction grating; and a $\lambda/4$ phase shift section formed in a region, from among said plurality of regions, where a refractive index is larger than the other regions.

5. A semiconductor laser apparatus comprising:

a semiconductor laser capable of switching a polarization mode of its output light, said laser including a plurality of regions arranged along a cavity of said laser, said plurality of regions each including an active layer and a diffraction grating, effective refractive indices of said plurality of regions being different from each other, and a region where the effective refractive index is larger than the other region(s), being provided with a $\lambda/4$ phase shift section; and a control circuit for performing a control for switching the polarization mode of said laser to said region provided with said $\lambda/4$ phase shift section.

6. A semiconductor laser according to claim 5, wherein said control is a control for controlling an amount of a current injected into said region provided with said $\lambda/4$ phase shift section.

* * * * *